(12) United States Patent
De Santis et al.

(10) Patent No.: US 7,272,694 B2
(45) Date of Patent: Sep. 18, 2007

(54) CHIP PROTECTION REGISTER LOCK CIRCUIT IN A FLASH MEMORY DEVICE

(75) Inventors: Luca De Santis, Avezzano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/583,675

(22) Filed: Oct. 19, 2006

(65) Prior Publication Data

US 2007/0038828 A1 Feb. 15, 2007

Related U.S. Application Data

(63) Continuation of application No. 10/854,397, filed on May 26, 2004, now Pat. No. 7,143,255.

(30) Foreign Application Priority Data

Dec. 18, 2003 (IT) .......................... RM2003A0583

(51) Int. Cl.
*G06F 12/00* (2006.01)
(52) U.S. Cl. ..................................................... 711/163
(58) Field of Classification Search ................ 711/163, 711/103
See application file for complete search history.

(56) References Cited

U.S. PATENT DOCUMENTS

| | | | |
|---|---|---|---|
| 5,594,686 A | 1/1997 | Hazen | |
| 6,031,757 A | 2/2000 | Chuang | |
| 6,643,751 B2 | 11/2003 | Rosenquist | |
| 7,143,255 B2 * | 11/2006 | De Santis et al. | .......... 711/163 |

* cited by examiner

*Primary Examiner*—Hiep T. Nguyen
(74) *Attorney, Agent, or Firm*—Leffert, Jay & Polglaze P.A.

(57) ABSTRACT

A chip protection register lock circuit uses a plurality of lock bits in a lock bit register. If the register contains N bits, N/2 bits of the register are coupled to an erase circuit and the remaining N/2 bits are coupled to a programming circuit. After the chip protection register is programmed, the group of N/2 bits coupled to the erase circuit are erased and the remaining N/2 bits are programmed such that an alternating pattern of logical ones and zeros are in the lock bit register. A read and compare circuit generates a lock indication if the alternating pattern is present.

14 Claims, 5 Drawing Sheets

CHIP PROTECTION REGISTER LOCK CIRCUIT IN A FLASH MEMORY DEVICE

RELATED APPLICATION

This application is a Continuation of U.S. patent application Ser. No. 10/854,397 (allowed), filed May 26, 2004 now U.S. Pat. No. 7,143,255, entitled "CHIP PROTECTION REGISTER LOCK CIRCUIT IN A FLASH MEMORY DEVICE" which claims priority to Italian Patent Application Ser. No. RM2003A000583, filed Dec. 18, 2003, entitled "CHIP PROTECTION REGISTER LOCK CIRCUIT IN A FLASH MEMORY DEVICE," which is commonly assigned.

TECHNICAL FIELD OF THE INVENTION

The present invention relates generally to memory devices and in particular the present invention relates to chip protection registers in flash memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

Flash memory devices typically have a chip protection register that is implemented using non-volatile, flash memory cells. The register is used by the flash memory end-user to store data that needs to be protected from erasure. Once the data is stored and the lock bit is erased (i.e., a logic 1 state), the data cannot be changed.

FIG. 1 illustrates a typical prior art lock bit circuit. The lock bit 101 is erased after fabrication of the memory device but prior to shipment to the end-user. The connection to the erase circuit 103 is broken so that after the program circuit 104 programs the lock bit, it cannot be erased. The lock bit is typically a floating gate avalanche injection metal oxide semiconductor (FAMOS) cell. The lock bit 101 is read by cell read circuitry 107 that determines if the protection register is locked., The lock bit may be surrounded and covered by circuitry and traces. Since the bit is erased with ultra-violet radiation, the surrounding circuitry may limit the amount of UV light that reaches the bit and, therefore, increase the chances that the bit will not be erased fully. The part may then ship with the bit already programmed so that the end-user cannot program the protection registers.

For the reasons stated above, and for other reasons stated below which will become apparent to those skilled in the art upon reading and understanding the present specification, there is a need in the art for a more reliable chip protection register lock circuit.

SUMMARY

The above-mentioned problems with the chip protection register and other problems are addressed by the present invention and will be understood by reading and studying the following specification.

The present invention encompasses a lock bit generation circuit. The circuit has a lock bit register that is made up of N lock bits wherein N is greater than one. A program circuit is coupled to a first group of lock bits. An erase circuit is coupled to a second group of lock bits. Both the first and second group of lock bits are comprised of N/2 lock bits.

A comparison circuit is coupled to the lock bit register. The comparison circuit generates a lock status bit when the lock bit register contains a predetermined pattern. In one embodiment, the predetermined pattern is an alternating pattern of logical ones and zeros.

Further embodiments of the invention include methods and apparatus of varying scope.

DETAILED DESCRIPTION

Figure 1:
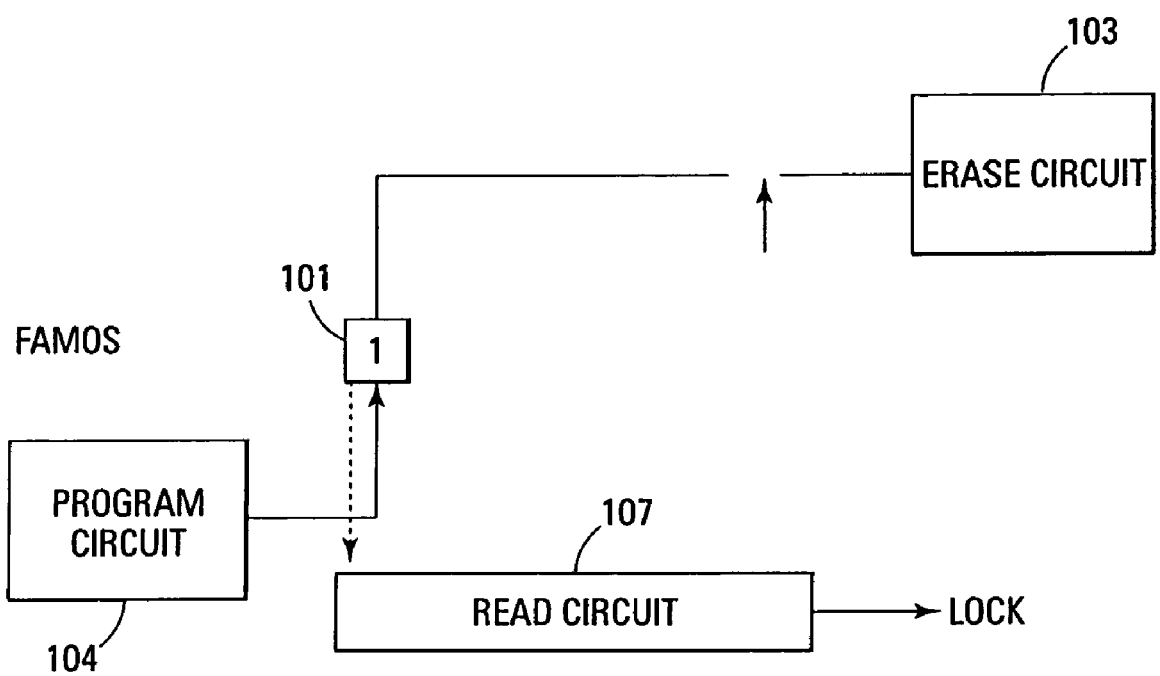
FIG. 1 shows a block diagram of a typical prior art protection register lock bit circuit.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
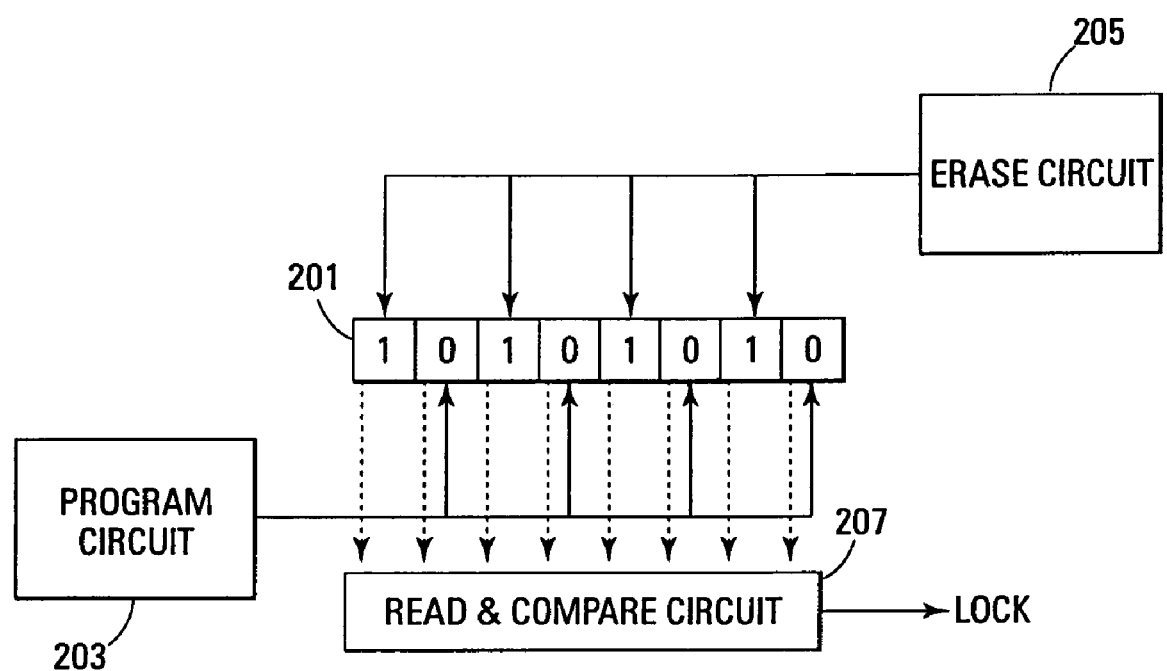
FIG. 2 shows a block diagram of one embodiment of a chip protection register lock circuit of the present invention.

FIG. 2 illustrates a block diagram of one embodiment of the chip protection register lock circuit of the present invention. The circuit is comprised of a register of 'N' lock bits 201. In one embodiment, the lock bits 201 are FAMOS cells and are designed within a miniarray of the memory device. The embodiment of FIG. 2 shows that 'N' is eight bits. However, the present invention is not limited to any one quantity of lock bits since the area required for a miniarray to be designed into a memory device is substantially the same whether one or multiple bits are used.

The lock bits 201 are coupled to a programming circuit 203 that programs the lock bits 201. The lock bits 201 are also coupled to an erase circuit 205 that erases the lock bits 201 during an erase operation. The erase circuit 205 is coupled to N/2 lock bit cells while the remaining N/2 lock bit cells are coupled to the program circuit 203. In one embodiment, the odd lock bits are coupled to the erase circuit 205 and the even lock bits are coupled to the programming circuit 203. The program and erase circuits 203 and 205 are well known in the art and are not discussed further.

The output of the lock bit register 201 is coupled to a read and compare circuit 207. This circuit is illustrated in greater detail in FIG. 4. In one embodiment, the lock signal output from the read and compare circuit 201 indicates a lock status only when N/2 FAMOS cells are read as programmed (i.e., logic 0) and the remaining N/2 FAMOS cells are read as erased (i.e., logic 1). Alternate embodiments use alternate logic levels to indicate programmed, erased, and locked conditions.

Figure 3:
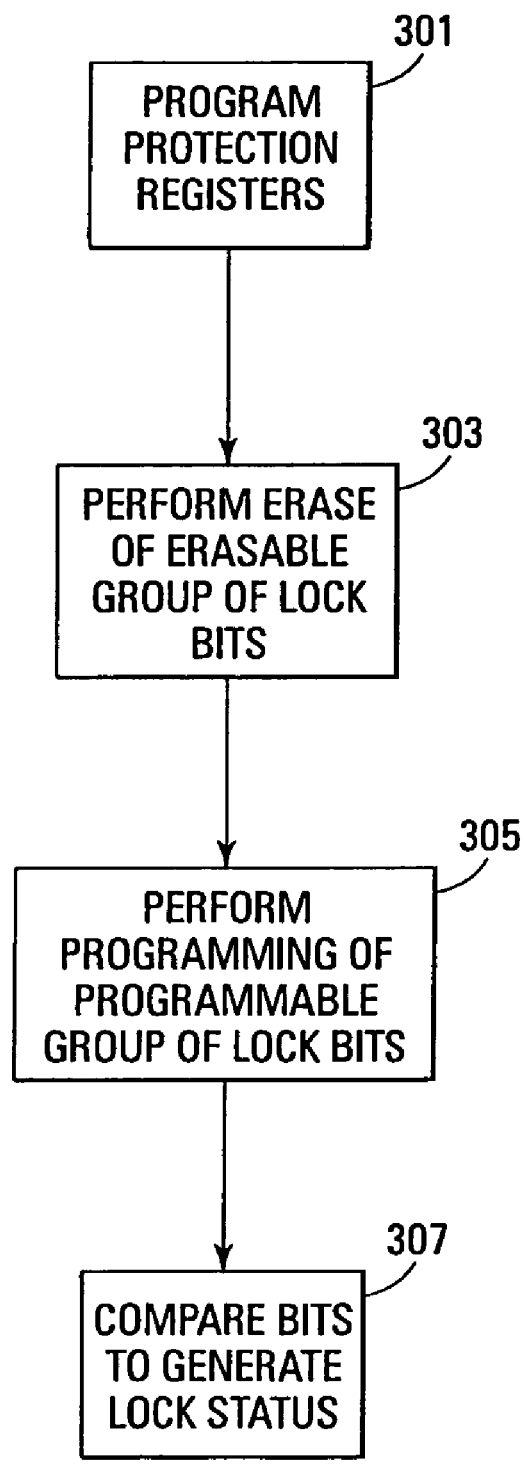
FIG. 3 shows a flow chart of one embodiment of a lock operation of the present invention.

A lock operation of the present invention is illustrated in the flow chart of FIG. 3. The protection registers are programmed by the memory device end user or the factory with the desired information 301. An erase operation is performed on the group of lock bits that are coupled to the erase circuitry 303. A program operation is performed on the group of lock bits that are coupled to the program circuitry 305. The resulting bits are then read and compared to a predetermined lock pattern to determine the lock status of the circuit 307.

Since the normal erased state of a FAMOS cell is a logic "1" and a normal FAMOS cell programmed state is a logic "0", the lock bits register will alternate in a 10101010 pattern when the register is set in a locked state.

Figure 4:
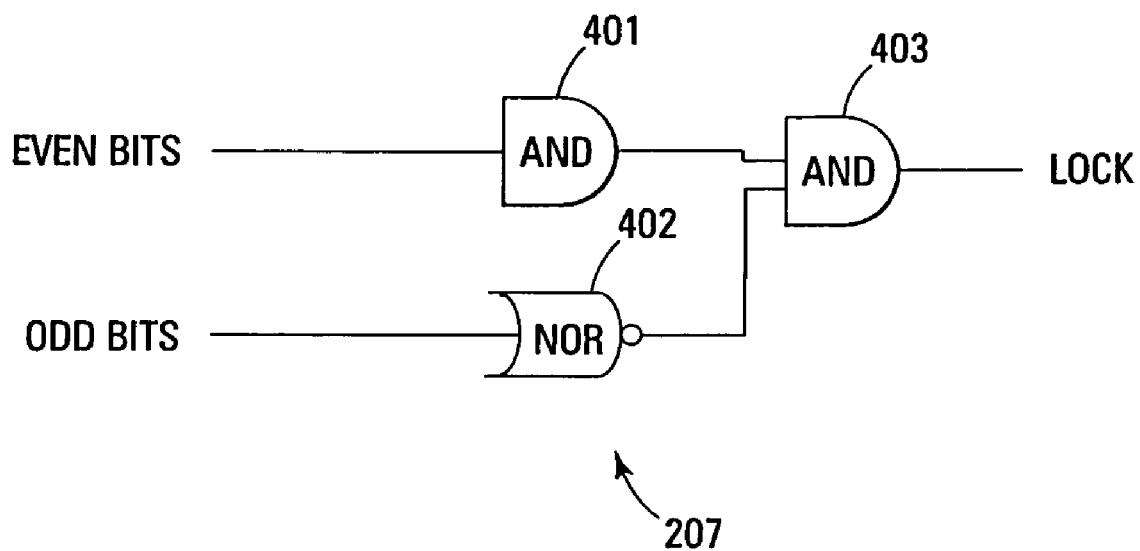
FIG. 4 shows a logic diagram of one embodiment of a comparison circuit in accordance with the circuit of FIG. 2.

FIG. 4 illustrates a logic diagram of the read and compare circuit 207 of the present invention in accordance with the lock bit generation circuit of FIG. 2. The inputs of the input AND gate 401 are coupled to the even N/2 FAMOS cells (i.e., 0, 2, 4, 6) of the lock bit register. The inputs of the NOR gate 402 are coupled to the odd N/2 FAMOS (i.e., 1, 3, 5, 7) cells of the lock bit register. In one embodiment, the even N/2 FAMOS cells are the logical ones of the lock bit register and the odd N/2 FAMOS cells are the logical zeros.

The outputs of the input AND gate 401 and the NOR gate 402 are logically combined with an AND gate 403 that outputs a logical one with its inputs are true. In one embodiment, if the lock pattern in the lock bit register is 10101010, the output lock status (LOCK) of the read and compare circuit 207 is a logical high indicating a locked status for the memory device's protection register. If any of the inputs do not match the required pattern, the output will be a logical zero indicating an unlocked status for the protection register.

The above-described logic levels are for purposes of illustration only. Inverse logic levels may be obtained by using a different lock pattern and/or a different read and compare circuit to generate a logical zero output to indicate a locked status.

Figure 5:
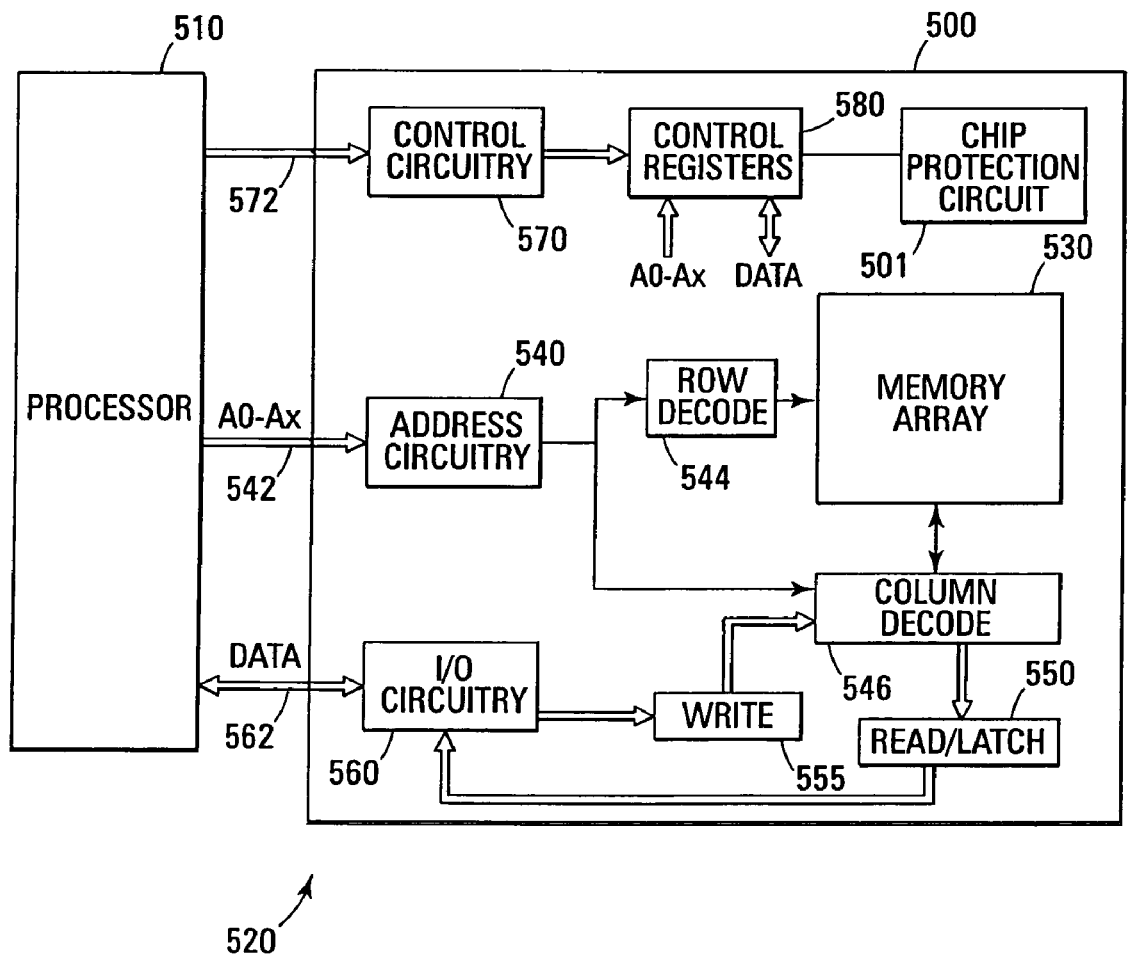
FIG. 5 shows a block diagram of an electronic system of the present invention.

FIG. 5 illustrates a functional block diagram of a memory device 500 that can incorporate the lock bit generation circuit of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530. The memory array 530 is arranged in banks of rows and columns. The control gates of each row of memory cells are coupled with a wordline while the drain and source connections of the memory cells are coupled to bitlines. As is well known in the art, the connection of the cells to the bitlines depends on whether the array is a NAND architecture or a NOR architecture.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510). Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

The chip protection circuit 501 of the present invention, in one embodiment, uses a dedicated lock bit register as described above. The chip protection circuit may be a miniarray that is separate from the memory array 530, as illustrated in FIG. 5, or part of the memory array 530.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the lock bit generation circuit of the present invention minimizes the probability that a memory device will be locked prior to programming the chip protection registers and immediately after an ultraviolet erase, with the consequent yield loss. The threshold voltage, $V_t$, distribution after an erase operation, such as with an ultraviolet erase, is mainly below the read levels used to read the cell as erased. In a worst case evaluation of threshold voltages, it is assumed that the lock bit register miniarray is built with eight bits and the threshold voltages of the eight bits are completely independent. The probability that the memory device is locked immediately after the ultraviolet erase operation can be computed as follows:

$$Pi(P)=0.1=x$$

$$Pi(E)=0.9=(1-x)$$

$$P(i)=(1-x)*x*(1-x)*x*(1-x)*x*(1-x)*x=x^{4(1-x)}$$

where Pi(P) is the probability of a bit read as not erased after the ultraviolet erase operation, Pi(E) is the probability of a bit read as erased after the ultraviolet erase operation, and P(i) is the probability that the memory device is locked. For an x of 10%, this results in P(i)=6.56E-05 or a yield loss of 0.007% (7 dies out of 1000). For an x of 20%, this results in P(i)=6.55E-05 or a yield loss of 0.066% (66 dies out of 1000). For an x of 30%, this results in P(i)=1.94E-03 or a yield loss of 0.194% (194 dies out of 1000). This shows that the greater the quantity of lock bits used, the lower the die loss.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
   a memory array comprising a plurality of non-volatile memory cells;
   an N-bit mini array comprising non-volatile memory cells that is separate from the memory array; and
   means for generating a lock indication comprising:
      means for programming a first group comprising a first predetermined quantity of bits of the N-bit mini array;
      means for erasing a second group comprising a second predetermined quantity of bits of the N-bit mini array; and
      means for comparing bits within each of the first and second groups for generating the lock indication when the mini array contains a predetermined lock pattern.

2. The device of claim 1 wherein the means for comparing comprises a NOR function coupled to the first group and an input AND function coupled to the second group.

3. The device of claim 2 wherein the means for comparing further comprises an output AND function coupled to the NOR and the input AND such that a logical one is generated when the mini array contains the predetermined lock pattern.

4. The device of claim 1 wherein the first group is comprised of N/2 bits of the N-bit mini array and the second group is comprised of the remaining N/2 bits of the N-bit mini-array.

5. The device of claim 1 wherein N=8 and the predetermined lock pattern is 10101010.

6. The device of claim 1 wherein the non-volatile memory device is a NAND flash memory device.

7. The device of claim 1 wherein the non-volatile memory device is a NOR flash memory device.

8. A method for generating a lock indication in a memory device, the memory device having a non-volatile memory array and a non-volatile mini array that is separate from the memory array and comprising N bits, the method comprising:
   performing an erase operation on a first group of the N bits;
   performing a programming operation on a second group of the N bits;
   comparing each of the first group and the second group to respective predetermined patterns; and
   generating the lock indication in response to the comparison.

9. The method of claim 8 wherein the first group is comprised of N/2 bits of the N-bit non-volatile register.

10. The method of claim 8 wherein the second group is comprised of the remaining N/2 bits of the N-bit non-volatile register.

11. The method of claim 8 wherein the erase operation is performed on even N/2 bits of the lock bit register and the programming operation is performed on odd N/2 bits of the N-bit non-volatile register.

12. The method of claim 8 wherein the first group is compared to a predetermined pattern of all logical ones and the second group is compared to a predetermined pattern of all logical zeros.

13. An electronic system comprising:
   a processor that generates control signals; and
   a non-volatile memory device, coupled to the processor, for storing data in a non-volatile memory array in response to the control signals, the non-volatile memory device comprising:
      a memory array comprising a plurality of memory cells;
      a mini array comprising N non-volatile lock bits that is separate from the memory array; and
      a lock indication circuit coupled to the mini array, the circuit comprising:
         a program circuit coupled to a first group of the N non-volatile lock bits, the first group comprising a first predetermined quantity of the N non-volatile lock bits;
         an erase circuit coupled to a second group of the N non-volatile lock bits, the second group comprising a second predetermined quantity of the N non-volatile lock bits; and
         a comparison circuit for comparing the first group to a first predetermined pattern, the second group to a second predetermined pattern, and generating a lock indication in response to the comparisons.

14. The system of claim 13 wherein the comparison circuit comprises a NOR function coupled to the first group, an input AND function coupled to the second group, and an output AND function coupled to the NOR and input AND functions such that the lock indication is a logical one in response to the N non-volatile lock bits storing a predetermined lock pattern.

* * * * *